(12) United States Patent
Kugler et al.

(10) Patent No.: US 8,553,202 B2
(45) Date of Patent: Oct. 8, 2013

(54) PROJECTION OBJECTIVE FOR MICROLITHOGRAPHY

(75) Inventors: Jens Kugler, Aalen (DE); Tilman Schwertner, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 876 days.

(21) Appl. No.: 12/724,496

(22) Filed: Mar. 16, 2010

(65) Prior Publication Data

US 2010/0201964 A1 Aug. 12, 2010

Related U.S. Application Data

(63) Continuation of application No. PCT/EP2008/008288, filed on Sep. 30, 2008.

(60) Provisional application No. 60/977,702, filed on Oct. 5, 2007.

(30) Foreign Application Priority Data

Oct. 1, 2007 (DE) .......................... 10 2007 047 109

(51) Int. Cl.
*G03B 27/54* (2006.01)
*G03B 27/42* (2006.01)

(52) U.S. Cl.
USPC .............................................. 355/67; 355/53

(58) Field of Classification Search
USPC ..................... 355/30, 53, 67; 359/818–820
See application file for complete search history.

(56) References Cited

U.S. PATENT DOCUMENTS

| | | | |
|---|---|---|---|
| 5,307,102 A | 4/1994 | Ohara | |
| 5,459,369 A | 10/1995 | Mitarai et al. | |
| 5,852,518 A | 12/1998 | Hatasawa et al. | |
| 6,304,317 B1 | 10/2001 | Taniguchi et al. | |
| 6,307,688 B1 | 10/2001 | Merz et al. | |
| 6,400,516 B1 | 6/2002 | Spinali | |
| 6,522,392 B1 | 2/2003 | Müller-Rissmann et al. | |
| 7,692,884 B2 * | 4/2010 | Ishikawa | 359/819 |
| 7,729,065 B2 * | 6/2010 | Schoeppach et al. | 359/819 |
| 2002/0163741 A1 | 11/2002 | Shibazaki | |
| 2004/0008429 A1 | 1/2004 | Watson et al. | |
| 2006/0139775 A1 | 6/2006 | Shibazaki | |
| 2007/0102504 A1 | 5/2007 | Cohen | |
| 2007/0183064 A1 | 8/2007 | Shibazaki | |
| 2007/0216888 A1 | 9/2007 | Kugler et al. | |
| 2008/0055756 A1 | 3/2008 | Ishikawa | |
| 2008/0144199 A1 | 6/2008 | Schoeppach et al. | |
| 2008/0218721 A1 | 9/2008 | Schoeppach et al. | |
| 2008/0285002 A1 | 11/2008 | Rief | |

FOREIGN PATENT DOCUMENTS

| | | |
|---|---|---|
| DE | 198 59 634 | 6/2000 |
| DE | 199 56 354 | 6/2001 |
| DE | 10 2005 057 860 | 6/2007 |
| EP | 1 179 746 | 2/2002 |

(Continued)

*Primary Examiner* — Hung Henry Nguyen
(74) *Attorney, Agent, or Firm* — Fish & Richardson P.C.

(57) ABSTRACT

An optical system includes an optical element having adjusting elements. The optical element is connected to a rotatable carrying ring via at least one connecting member arranged on the carrying ring directly or via one or a plurality of intermediate elements to the optical element. The rotatable carrying ring is borne in a manner freely rotatable about an axis relative to a fixed outer mount or the optical element via a rotating device. The outer mount, the rotatable carrying ring and the connecting members are constructed as rotatable kinematics in the form of parallel kinematics.

30 Claims, 4 Drawing Sheets

(56) References Cited

FOREIGN PATENT DOCUMENTS

| EP | 1 278 089 | 1/2003 |
| EP | 1 480 082 | 11/2004 |
| EP | 1 586 923 | 10/2005 |
| WO | WO 2004/019128 | 3/2004 |
| WO | WO 2005/026801 | 3/2005 |
| WO | WO 2005/101131 | 10/2005 |
| WO | WO 2007/017013 | 2/2007 |
| WO | WO 2007/031412 | 3/2007 |

\* cited by examiner

PROJECTION OBJECTIVE FOR MICROLITHOGRAPHY

CROSS-REFERENCE TO RELATED APPLICATIONS

This application is a continuation of, and claims benefit under 35 USC 120 to, international application PCT/EP2008/008288, filed Sep. 30, 2008, which claims benefit of German Application No. 10 2007 047 109.4, filed Oct. 1, 2007 and U.S. Ser. No. 60/977,702, filed Oct. 5, 2007. International application PCT/EP2008/008288 is hereby incorporated by reference in its entirety.

FIELD

The disclosure relates to an optical system including at least one optical element which is provided with adjusting elements. The system is particularly suitable for a projection objective for microlithography for the production of semiconductor elements.

BACKGROUND

A projection objective for microlithography is disclosed, for example, in DE 198 59 634 A1 (U.S. Pat. No. 6,307,688) and US 2002/0163741 A1.

U.S. Pat. No. 5,852,518 presents a projection objective for microlithography with a rotatable mount technology. This reference discloses that one lens is rotated in a frame about an optical axis z relative to another lens. Both lenses have astigmatic surfaces. Imaging aberrations can be corrected via the rotating device. If a third-order deformation is present, for example in the case of a lens borne at three points, then this deformation can be compensated for at two lenses having the same deformation via corresponding rotation of the two lenses with respect to one another. This can be carried out with lenses having similar optical properties in the overall objective. It is possible to perform, for example, rotations through 60° in the case of a third-order deformation, whereby image aberrations are compensated for again.

SUMMARY

In some embodiments, the disclosure provides an optical system, such a a projection objective for microlithography, with which image aberrations can be eliminated in the simplest possible manner and exactly including during operation.

The arrangement according to the disclosure of a rotatable carrying ring between the optical element and the outer mount makes it possible to carry out a rotation of the optical element about the optical axis of any desired magnitude or any desired angle of rotation. At the same time, however, it is possible in this case to maintain a decoupling of the optical element from forces and moments in order to avoid deformations of the optical element.

In one advantageous configuration of the disclosure, a deformation decoupling can be effected in a simple manner by virtue of the fact that the connecting members are embodied as bipods. In this case, it may be provided that the outer mount, the rotatable carrying ring and the bipods are constructed as rotatable kinematics in the form of a hexapod. This configuration gives rise to rotatable parallel kinematics for the compensation of image aberrations.

The construction as parallel kinematics is important. In this case, if appropriate, a construction having five degrees of freedom (DOF), i.e. five connecting members, would also be able to be used as mount. The number of degrees of freedom is determined depending on the number of actuators as connecting members. Six degrees of freedom arise in the case of a hexapod.

In contrast to serial kinematics, wherein each actuator acts on a dedicated actuating platform, in the case of parallel kinematics all the actuators act directly on the same moved platform, on the optical element in the present case. This results in advantages that include lower mass inertia, no moved cables, lower centre of gravity, no accumulation of guide thoughts and more compact construction.

Desirably, all the actuators act on the same platform, namely the optical element, and can moved independently of one another.

In this case, the number of connecting members is determined by the assembly and alignment process. If the assembly process involves mobility in three degrees of freedom in order to compensate for manufacturing tolerances, then at least three connecting members are to be provided.

In a further advantageous configuration of the disclosure, the bearing between the outer mount and the carrying ring will be embodied as an isostatic bearing. The isostatic bearing prevents deformations from being introduced. An isostatic bearing furthermore has the advantage that it guarantees a very highly reproducible deformation state of the optical system. Alignment processes of the objective are thus possible which involve a repeated installation and demounting of the carrying ring.

For this purpose, for example, the bearing can be embodied in such a way that the isostatic bearing a pan bearing is provided with at least three bearing elements with spherical profile form, pan-like or circular receptacles receiving the bearing elements with their spherical profile forms.

If in this case three bearing bodies of spherical form or hemispherical form as spherical profile form are arranged in a manner distributed over the circumference, it is possible to achieve a rotation in each case through 120°. With a correspondingly higher number, the possible rotation angles become correspondingly smaller or it is possible to achieve a more accurate scanning.

If, for example, a circumferential wedge-shaped groove receives the bearing bodies, it is possible to achieve a continuously variable adjustment.

Advantageous further configurations and developments of the disclosure are evident from the rest of the dependent claims and from the exemplary embodiments illustrated in principle below with reference to the drawings.

DETAILED DESCRIPTION

Figure 1:
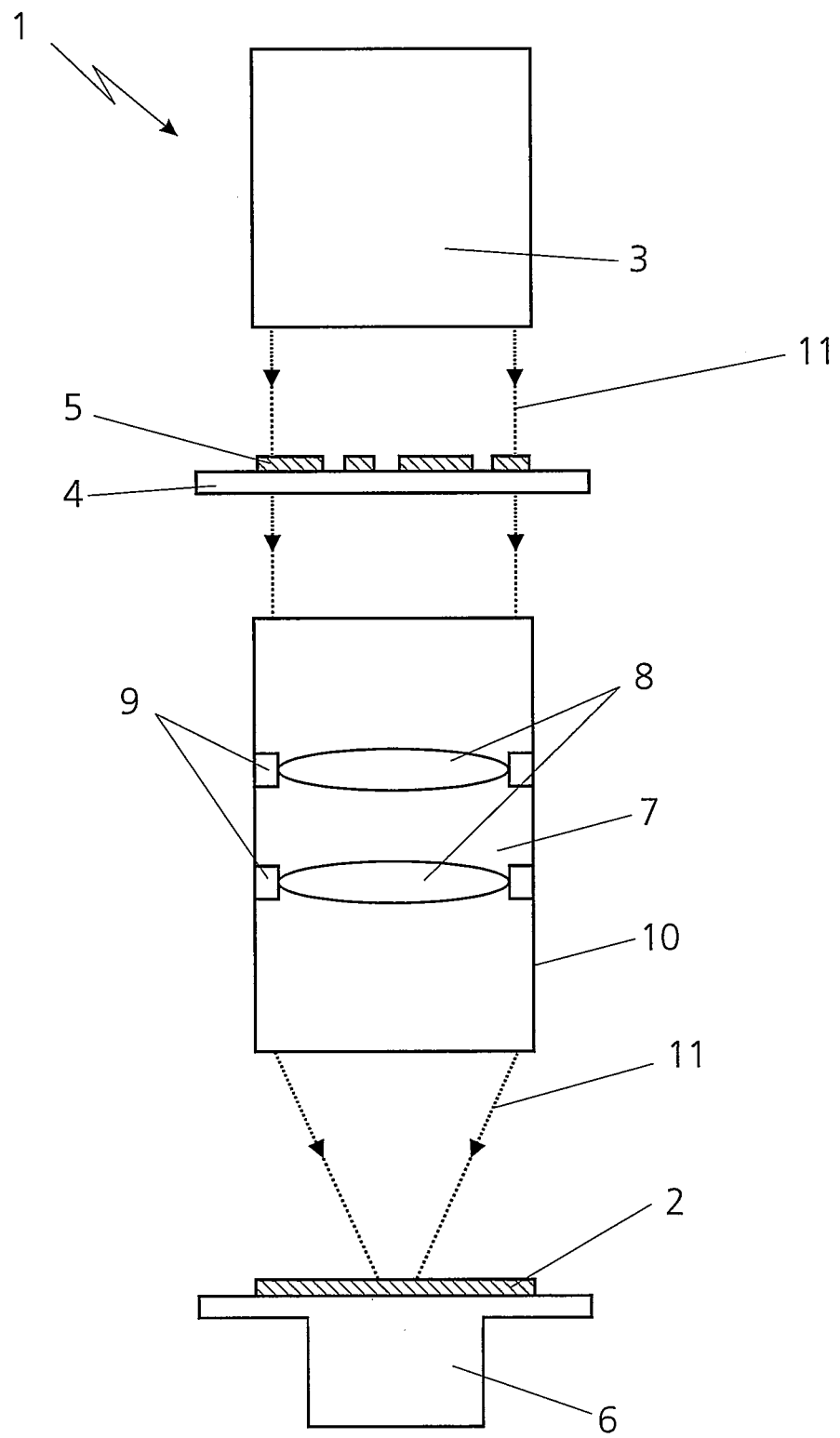
FIG. 1 shows a basic illustration of a projection objective for microlithography.

FIG. 1 illustrates a projection exposure apparatus 1 for microlithography. The apparatus serves for the exposure of structures onto a substrate coated with photosensitive materials, which substrate generally predominantly consists of silicon and is designated as wafer 2, for the production of semiconductor components, such as e.g. computer chips.

In this case, the projection exposure apparatus 1 essentially includes an illumination device 3, a device 4 for receiving and exactly positioning a mask provided with a gridlike structure, a so-called reticle 5, which is used to determine the later structures on the wafer 2, a device 6 for retaining, moving and exactly positioning precisely the wafer 2, and an imaging device, namely a projection objective 7, including a plurality of optical elements, such as lenses 8, for example, which are borne via mounts 9, which can each be formed from a plurality of parts, in an objective housing 10 of the projection objective 7.

In this case, the basic functional principle provides for the structures introduced into the reticle 5 to be imaged onto the wafer 2 in demagnified fashion.

After an exposure has taken place, the wafer 2 is moved further in the arrow direction, such that a multiplicity of individual fields, each with the structure prescribed by the reticle 5, are exposed on the same wafer 2. On account of the step-by-step advancing movement of the wafer 2 in the projection exposure apparatus 1, the latter is often also referred to as a stepper.

The illumination device 3 provides a projection beam 11, for example light or a similar electromagnetic radiation, involved for the imaging of the reticle 5 on the wafer 2. A laser or the like can be used as a source for the radiation. The radiation is shaped in the illumination device 3 via optical elements in such a way that the projection beam 11, upon impinging on the reticle 5, has the desired properties with regard to diameter, polarization, shape of the wavefront and the like.

Via the projection beam 11, an image of the reticle 5 is generated and transferred to the wafer 2 in correspondingly demagnified fashion by the projection objective 7, as has already been explained above. The projection objective 7 has a multiplicity of individual refractive, diffractive and/or reflective optical elements such as e.g. lenses, mirrors, prisms, terminating plates and the like.

FIGS. 2 to 6 illustrate a rotating device for an optical element, for example one of the lenses 8 of the projection objective 7 in an enlarged illustration. An outer mount 9, which can e.g. also form part of the objective housing 10 in a known manner, is connected to a carrying ring 12 via a turning device, which will be described in greater detail below. Three bipods 13 are arranged on the carrying ring 12 in a manner distributed uniformly over the circumference. In this case, the foot parts 13a and 13b of the bipods are connected to the carrying ring 12 and a head region 13c, at which the two foot parts 13a and 13b arranged in wedge-shaped fashion converge, is connected to attachments 14 arranged on the optical element 8. The attachments 14, the bipods 13 and the carrying ring 12 can be embodied monolithically, that is to say in one piece from the same material.

Figure 2:
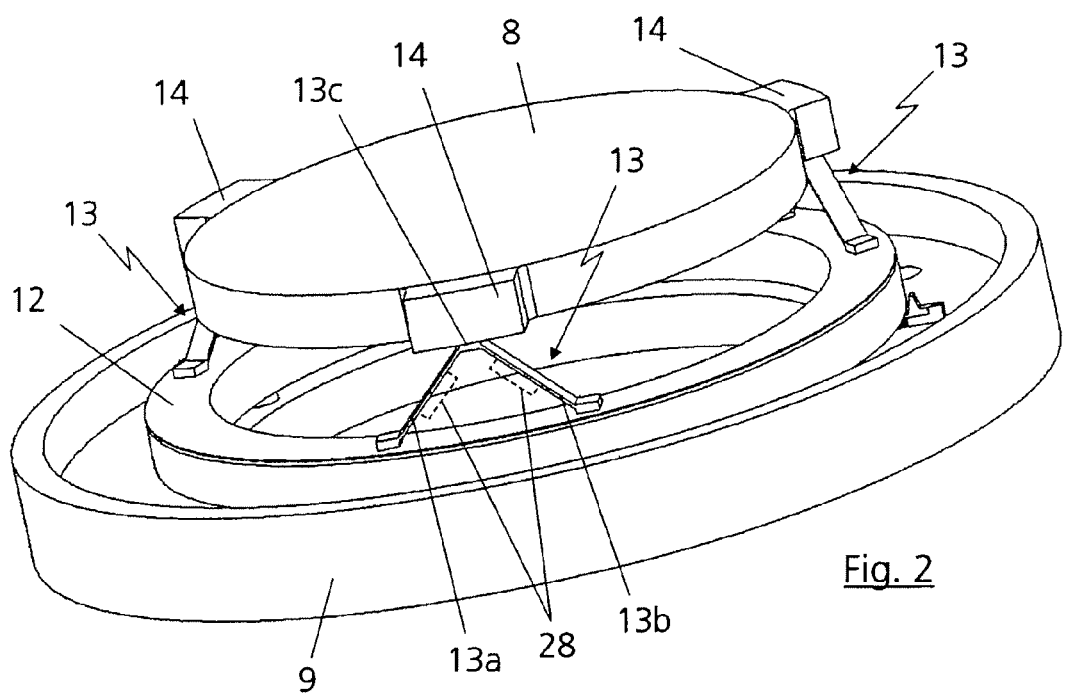
FIG. 2 shows a perspective illustration of the rotating device according to the disclosure for an optical element.
Figure 3:
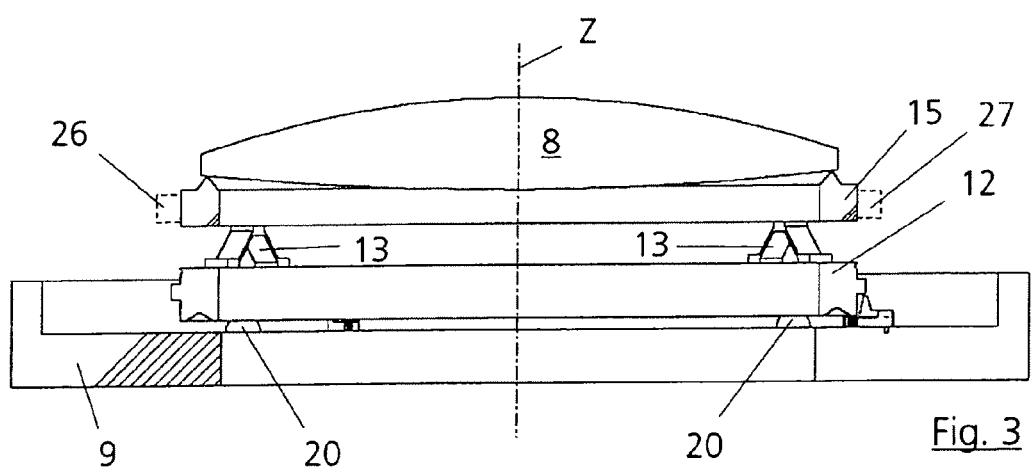
FIG. 3 shows a longitudinal section through the rotating device according to the disclosure for an optical element with a supporting ring.

FIG. 3 shows, in principle, the same configuration as the rotating device according to FIG. 2, but instead of three attachments 14, a supporting ring 15 is provided for the optical element 8, the head regions 13c of the bipods 13 in each case being arranged at the supporting ring. The additional supporting ring 15 makes it possible to prevent an impermissible sagging of the lens on account of its own weight.

Figure 4:
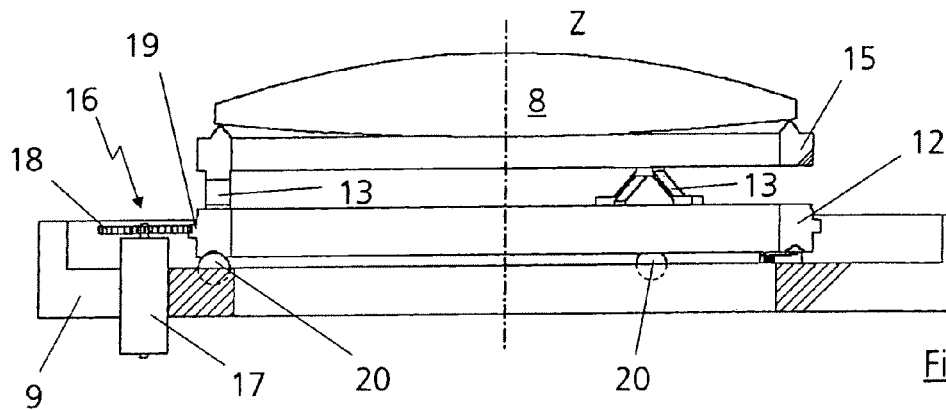
FIG. 4 shows a longitudinal section through the rotating device according to FIG. 3 with a turning device.
Figure 5:
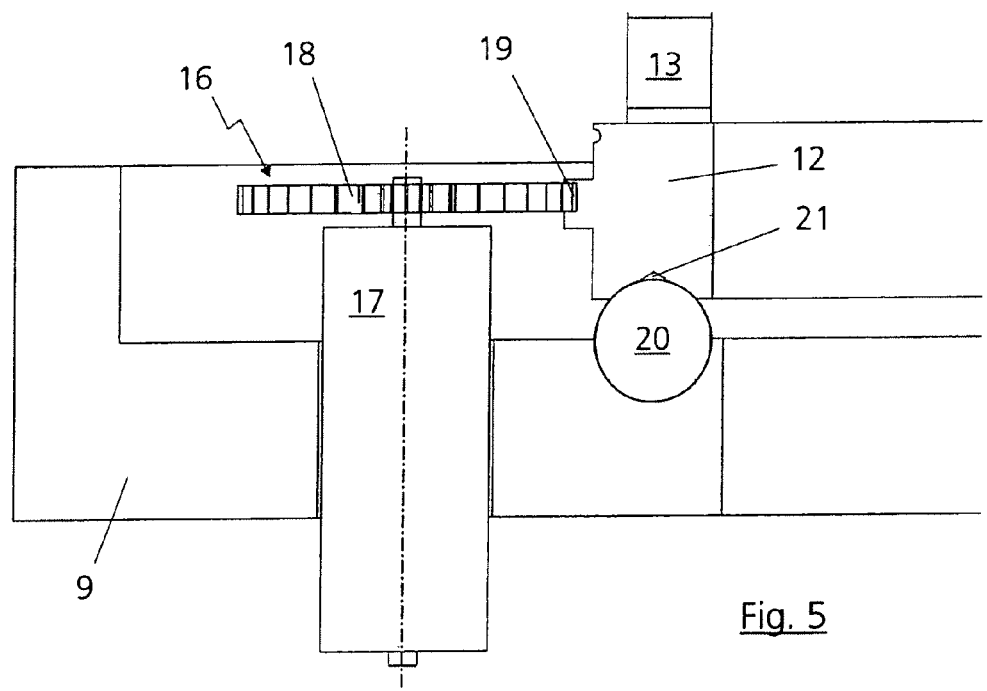
FIG. 5 shows an enlarged partial illustration of the rotating device according to FIG. 4 with the turning device.

FIG. 4 shows one of the possible types for an isostatic bearing with a rotating device 16 between the carrying ring 12 and the fixed outer mount 9. The lens 8 can be rotated about an optical axis z by the rotating device 16. A drive motor 17 (not illustrated in greater detail) is arranged in the outer mount 9 and can rotate a toothed ring 19, arranged on the carrying ring 12, via a gearwheel drive with a pinion 18. An isostatic bearing between the carrying ring 12 and the outer mount 9 can have three bearing bodies 20 of spherical or hemispherical profile form which are arranged in a manner distributed uniformly over the circumference and which are arranged in the mount 9 and which are received in pan- or wedge-shaped receptacles 21 introduced in the carrying ring 12. FIG. 5 shows an enlarged illustration in this respect.

Figure 6:
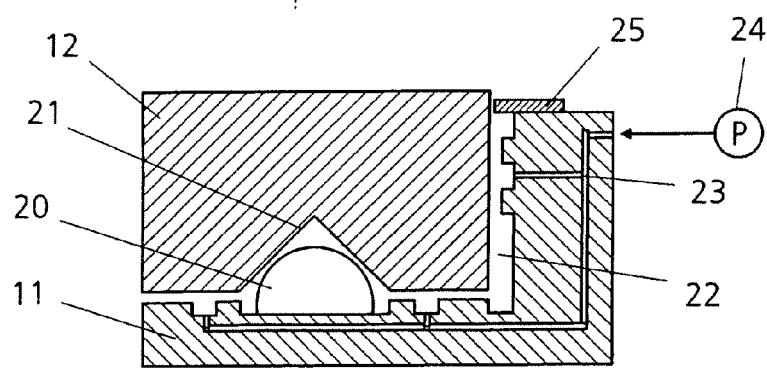
FIG. 6 shows an enlarged partial illustration of the rotating device according to FIG. 2 with an air bearing.

FIG. 6 also shows an air bearing 22 between the carrying ring 12 and the outer mount 9. The air bearing 22 has a plurality of channels 23 which are arranged in the outer mount 9 and which are connected to a compressed air source 24 (not illustrated more specifically). The channels 23 open into the interspace between the outer mount 9 and the carrying ring 12 and thus form an air bearing for raising the carrying ring 12, whereby a frictionless movement is achieved. If no rotation is provided, the carrying ring 12 is correspondingly seated on the outer mount 9 and is thereby positioned. For position measurement, sensors 25 (not illustrated more specifically) arranged in a manner distributed over the circumference can be provided on the outer mount 9, which sensors are embodied e.g. as capacitive sensors and determine the position of the carrying ring 12 relative to the outer mount 9 and hence also the position of the lens 8 contactlessly.

The rotating device 16 can also be embodied in such a way that the lens 8 acts as a rotor, while the carrying ring 12 is provided as a stator. In this case, provision will be made of force introduction members on the circumference of the optical element, such as e.g. lugs, teeth or magnets 26 (see dashed basic illustration in FIG. 3), which are then correspondingly moved by a drive device in a manner not illustrated more specifically, and serve as points of action. The lens 8 as rotor can then be moved by electrically initiated magnetic fields (in static or movable fashion) or by rams. As an alternative, a pneumatic or hydraulically operating rotating device is also possible.

If the drive force is transmitted via a field, e.g. magnetically or electrically, then the drive is mechanically decoupled from the lens 8, as a result of which no deformation forces can be introduced.

One possible configuration in this regard resides e.g. in the embodiment as an ultrasonic motor (USM), the rotation force being transmitted by an ultrasonic vibration energy. The vibration energy is used to produce a rotary movement. The method of operation and construction of a USM are generally known, for which reason an ultrasonic motor 27 is only indicated in basic schematic fashion in FIG. 3. With regard to the construction and the method of operation, reference is made for example to U.S. Pat. No. 5,307,102 and U.S. Pat. No. 5,459,369, the contents of which are likewise included in the disclosure contents of the present application.

In the case of relatively simple tasks, the rotating device 16 can be operated via a simple open-loop control. However, a closed-loop control circuit is also possible as desired.

As illustrated by dashed lines in FIG. 2, the connecting members 13, which are embodied as bipods in the present exemplary embodiment, can be provided with adjusting members 28. Changes in length of the adjusting members can be carried out by adjusting members 28. The lens 8 can be correspondingly manipulated depending on the setting of the lengths by the adjusting members 28 individually arranged on the foot parts 13a and 13b. In the case of a uniform change in length of all the adjusting members 28, the lens 8 can be displaced in a direction of the optical axis in this way. In the case of different length changes at the foot parts 13a and 13b it is also possible to carry out tiltings of the lens about the optical axis (z axis).

The wide variety of configurations are possible for the adjusting members in order to achieve the desired length changes. This can be effected for example mechanically, hydraulically, pneumatically or else by piezoelectric elements which change their length in the event of activation. A mechanical length change can be effected in a simple manner by set screws. Hybrid actuators are likewise possible as adjusting members.

Instead of a rotation of the carrying ring 12 via a rotating device 16 arranged between the carrying ring 12 and the fixed outer mount 9, it goes without saying that a configuration is also possible in which the connecting members 13, e.g. the exemplary embodiment with the three bipods are arranged between the carrying ring 12 and the outer mount 9 and the rotating device 16 is arranged between the carrying ring and the optical element 8 for one or a plurality of intervening intermediate elements 14 and 15. Parallel kinematics are used in this case, too.

Figure 7:
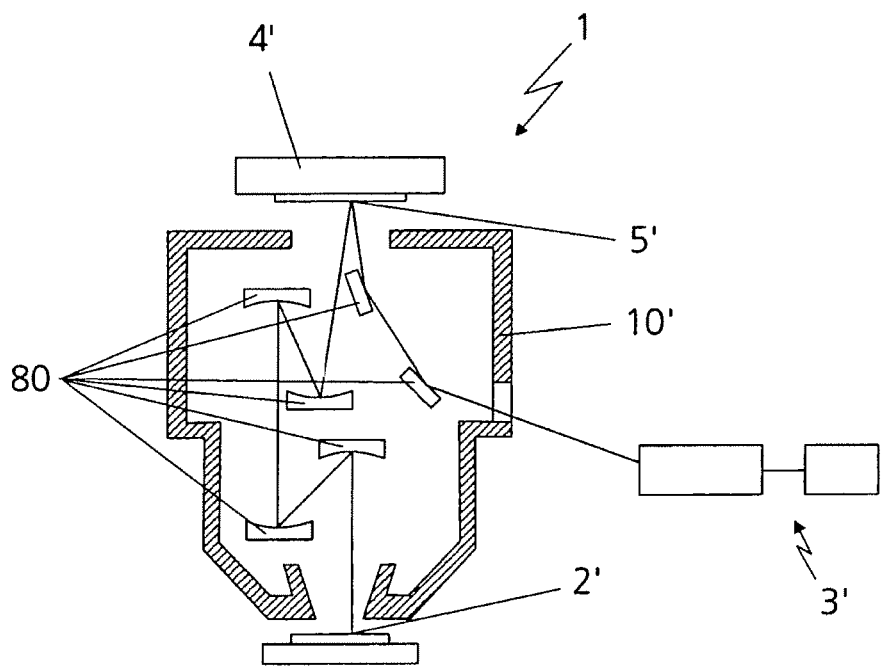
FIG. 7 shows a basic illustration of a projection objective for an EUV projection exposure system.

FIG. 7 illustrates the basic construction of an EUV projection exposure apparatus including an illumination system 3' and a plurality of mirrors 80 arranged in an objective housing 10' of a projection objective. The beam runs from the illumination system 3' via the reticle 4' and a plurality of mirrors 8 to the wafer 2'.

Since the basic construction of an EUV projection exposure apparatus is generally known, it is not discussed in any greater detail here. Merely by way of example, reference is made in this respect to WO 2005/026801 or EP 1 278 089 A2.

As is evident, in this exemplary embodiment, mirrors 80 are provided as optical elements instead of lenses 8. One or a plurality of mirrors 80 can in this case be connected, in the same way as described in the previous exemplary embodiments, to a rotatable carrying ring 12, connecting numbers 13 directly or via one or a plurality of intermediate elements, wherein the carrying ring is then borne in a freely rotatable manner via a rotating device in the same way.

Figure 8:
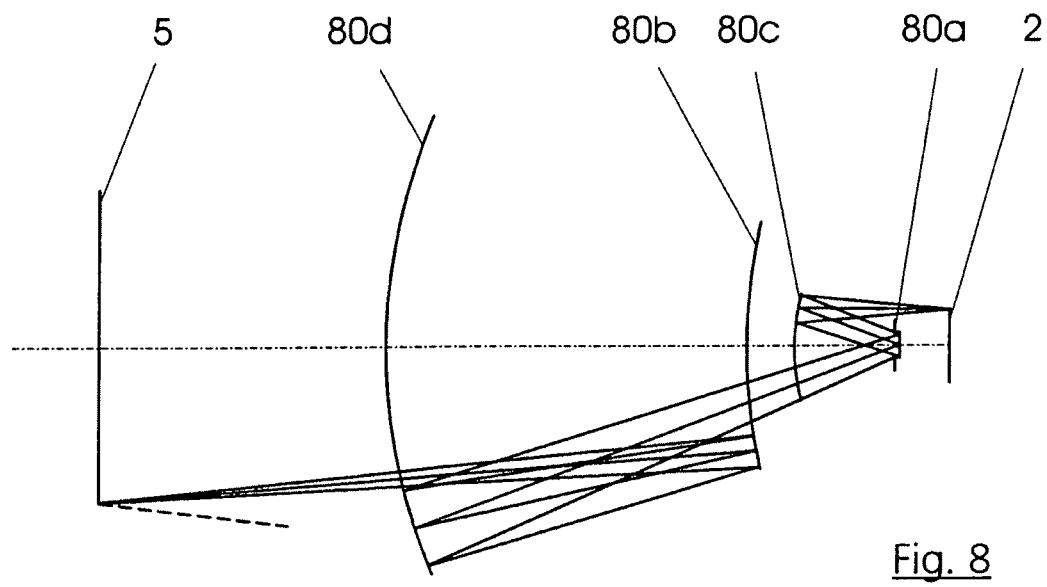
FIG. 8 shows a basic illustration of a group of mirrors in a projection objective with a pupil mirror.

A further configuration is illustrated in FIG. 8, wherein likewise in a projection objective mirrors 80a, 80b, 80c, 80d are provided between a reticle 5 and a wafer 2. In this case, the mirror 80a is a so-called pupil mirror. A projection objective having the abovementioned construction in accordance with FIG. 8 is evident e.g. from EP 1 480 082 A1.

In this exemplary embodiment, too, one or a plurality of mirrors (e.g., the pupil mirror 80a) can be borne in a rotatable manner in the manner according to the disclosure, as described above.

It goes without saying that a projection objective having a combination of lenses 8 and mirrors 80 as optical elements is also possible in the context of the configuration according to the disclosure.

It goes without saying that the projection objective having lenses and mirrors borne in a rotatable manner according to the disclosure can also be used in catadioptric objectives, wherein a plurality of optical axes with lenses and mirrors are present. In this respect, reference is made for example to WO 2004/019128 A2 (see e.g. FIG. 19).

What is claimed is:

1. An optical system, comprising:
an optical element comprising adjusting elements;
a rotatable carrying ring;
at least three connecting members arranged on the rotatable carrying ring directly or via at least one intermediate element, the at least three connecting members connecting the rotatable carrying ring to the optical element;
a fixed outer mount;
a rotating device; and
an isostatic bearing that connects the rotatable carrying ring to the fixed outer mount,
wherein:
via the rotating device, the rotatable carrying ring is freely rotatable about at least one axis relative to the fixed outer mount or the optical element; and
the fixed outer mount, the rotatable carrying ring and the at least three connecting members are rotatable kinematics in the form of parallel kinematics.

2. The optical system as claimed in claim 1, wherein the at least three connecting members are bipods.

3. The optical system as claimed in claim 1, further comprising adjusting members configured to adjust the lengths of the at least three connecting members in an axial direction.

4. The optical system as claimed in claim 2, wherein the bipods have foot ends connected to the rotatable carrying ring, and the bipods have head regions connected to the optical element by a force-locking, cohesive or positively locking connecting technique.

5. The optical system as claimed in claim 4, wherein the bipods are each connected in their head region to attachments arranged on a circumference of the optical element.

6. The optical system as claimed in claim 5, wherein the rotatable carrying ring, the bipods and the attachments are embodied monolithically.

7. The optical system as claimed in claim 2, wherein the bipods have head regions connected to a supporting ring on which the optical element bears.

8. The optical system as claimed in claim 7, wherein the rotatable carrying ring, the bipods and the supporting ring are embodied monolithically.

9. The optical system as claimed in claim 1, wherein the isostatic bearing has at least three bearing elements with spherical profile form, pan-like receptacles, or circular receptacles receiving the bearing elements with their spherical profile forms.

10. The optical system as claimed in claim 1, wherein the rotating device comprises a gearwheel drive.

11. The optical system as claimed in claim 10, wherein the gearwheel drive has a pinion in the fixed outer mount, the gearwheel drive is connected to a drive element, and the gearwheel drive has a toothed ring which cooperates with the pinion and which is arranged on the rotatable carrying ring.

12. The optical system as claimed in claim 1, wherein the rotating device comprises at least one turning device selected from the group consisting of a hydraulic turning device, a pneumatic turning device, a mechanical turning device and an electrical turning device.

13. The optical system as claimed in claim 1, wherein the rotating device is an electrical rotating device, the optical element has a rotor that is rotatable relative to the rotatable carrying ring, and the rotatable carrying ring is a stator.

14. The optical system as claimed in claim 1, further comprising force introduction members on the optical element, wherein the force introduction members are points of action for the rotating device.

15. The optical system as claimed in claim 14, wherein the force introduction members comprise lugs or teeth.

16. The optical system as claimed in claim 14, wherein the force introduction members comprise magnetic parts for the initiation of an electromagnetic field.

17. The optical system as claimed in claim 1, further comprising a bearing between the rotatable carrying ring and the fixed outer mount, wherein the bearing unit is a hydraulic bearing unit or a pneumatic bearing unit.

18. The optical system as claimed in claim 17, further comprising an air bearing between the rotatable carrying ring and the fixed outer mount.

19. The optical system as claimed in claim 18, wherein the air bearing has channels arranged in the fixed outer mount, the channels are connected to a compressed air source, and the channels end between the rotatable carrying ring and the fixed outer mount.

20. The optical system as claimed in claim 1, wherein the rotating device comprises piezoelectric drive members.

21. The optical system as claimed in claim 1, wherein the rotating device comprises an ultrasonic motor.

22. The optical system as claimed in claim 1, wherein the optical element and/or the rotatable carrying ring comprises sensors configured to monitor position.

23. The optical system as claimed in claim 1, wherein the optical system is a projection objective for microlithography.

24. The optical system as claimed in claim 1, wherein the optical element is a lens.

25. The optical system as claimed in claim 1, wherein the optical element is a mirror.

26. The optical system as claimed in claim 25, wherein the optical system is a projection objective for microlithography, and the mirror is near a pupil in the projection objective.

27. An optical system, comprising:
   an optical element comprising adjusting elements;
   a rotatable carrying ring;
   at least three bipods arranged on the rotatable carrying ring directly or via at least one intermediate element, the at least three bipods connecting the rotatable carrying ring to the optical element;
   a fixed outer mount; and
   a rotating device;
wherein:
   the bipods are each connected in a head region to attachments arranged on a circumference of the optical element;
   the rotatable carrying ring is freely rotatable about at least one axis relative to the fixed outer mount or the optical element via a rotating device; and
   the fixed outer mount, the rotatable carrying ring and the at least three connecting members are rotatable kinematics in the form of parallel kinematics.

28. The optical system as claimed in claim 27, wherein the bipods have foot ends connected to the rotatable carrying ring, and the head ends of the bipods are connected to the optical element by a force-locking, cohesive or positively locking connecting technique.

29. The optical system as claimed in claim 27, wherein the optical system is a projection objective for microlithography.

30. An apparatus, comprising:
   an illumination device; and
   a projection objective, comprising:
      an optical element comprising adjusting elements;
      a rotatable carrying ring;
      at least three connecting members arranged on the rotatable carrying ring directly or via at least one intermediate element, the at least three connecting members connecting the rotatable carrying ring to the optical element;
      a fixed outer mount;
      a rotating device; and
      an isostatic bearing that connects the rotatable carrying ring to the fixed outer mount,
wherein:
   the apparatus is a projection exposure apparatus for microlithography;
   the rotatable carrying ring is freely rotatable about at least one axis relative to the fixed outer mount or the optical element via a rotating device; and
   the fixed outer mount, the rotatable carrying ring and the at least three connecting members are rotatable kinematics in the form of parallel kinematics.

* * * * *

UNITED STATES PATENT AND TRADEMARK OFFICE
CERTIFICATE OF CORRECTION

| | | |
|---|---|---|
| PATENT NO. | : 8,553,202 B2 | Page 1 of 1 |
| APPLICATION NO. | : 12/724496 | |
| DATED | : October 8, 2013 | |
| INVENTOR(S) | : Jens Kugler et al. | |

It is certified that error appears in the above-identified patent and that said Letters Patent is hereby corrected as shown below:

In the Specification

Col. 1, line 46, delete "such a a" and insert -- such a --.

Signed and Sealed this
Twenty-eighth Day of January, 2014

Michelle K. Lee
*Deputy Director of the United States Patent and Trademark Office*